United States Patent
Davidson et al.

(10) Patent No.: US 8,107,719 B2
(45) Date of Patent: Jan. 31, 2012

(54) MACHINE VISION SYSTEM FOR THREE-DIMENSIONAL METROLOGY AND INSPECTION IN THE SEMICONDUCTOR INDUSTRY

(76) Inventors: Douglas Davidson, Saline, MI (US); Jon Upham, Saline, MI (US)

( * ) Notice: Subject to any disclaimer, the term of this patent is extended or adjusted under 35 U.S.C. 154(b) by 800 days.

(21) Appl. No.: 12/090,237

(22) PCT Filed: Nov. 13, 2006

(86) PCT No.: PCT/US2006/044040
§ 371 (c)(1),
(2), (4) Date: Sep. 22, 2008

(87) PCT Pub. No.: WO2007/059055
PCT Pub. Date: May 24, 2007

(65) Prior Publication Data
US 2009/0238442 A1    Sep. 24, 2009

Related U.S. Application Data
(60) Provisional application No. 60/735,778, filed on Nov. 12, 2005.

(51) Int. Cl.
G06K 9/00 (2006.01)
(52) U.S. Cl. .................................. 382/145; 382/154
(58) Field of Classification Search .................. 382/145, 382/154; 348/87, E7.085
See application file for complete search history.

(56) References Cited

U.S. PATENT DOCUMENTS

| | | | |
|---|---|---|---|
| 4,677,473 A | 6/1987 | Okamoto et al. | |
| 5,201,576 A | 4/1993 | Squyres | |
| 5,519,496 A | 5/1996 | Borgert et al. | |
| 5,544,252 A | 8/1996 | Iwaki et al. | |
| 5,686,994 A | 11/1997 | Tokura | |
| 6,101,455 A | 8/2000 | Davis | |
| 6,119,650 A | 9/2000 | Tanigawa et al. | |
| 6,542,236 B1 | 4/2003 | Kim | |
| 6,603,103 B1 | 8/2003 | Ulrich et al. | |
| 6,677,588 B1 | 1/2004 | Granneman | |
| 7,144,121 B2 | 12/2006 | Minano et al. | |
| 7,227,526 B2 * | 6/2007 | Hildreth et al. | 345/156 |
| 2002/0099643 A1 | 7/2002 | Abeshouse et al. | |
| 2002/0159052 A1 | 10/2002 | Klooster et al. | |
| 2003/0039388 A1 | 2/2003 | Ulrich et al. | |
| 2004/0138986 A1 | 7/2004 | Petrovich | |
| 2007/0221847 A1 | 9/2007 | Lettington et al. | |
| 2009/0073446 A1 | 3/2009 | Davidson et al. | |
| 2009/0238442 A1 | 9/2009 | Upham et al. | |

FOREIGN PATENT DOCUMENTS
WO PCT/US2007/085125    11/2007
WO       2008112021       9/2008
* cited by examiner

*Primary Examiner* — Tarifur Chowdhury
*Assistant Examiner* — Abdullahi Nur
(74) *Attorney, Agent, or Firm* — Jeffrey Schox

(57) ABSTRACT

The system 10 of the preferred embodiment includes a structural subsystem 20 to provide both a stable platform and vibration isolation, a camera subsystem 30 to capture the image of a moving object when the object moves into a viewing area, a lighting subsystem 50 to illuminate a moving object, and a controller to selectively activate the lighting subsystem 50 to allow observation of the reflectance of complex objects under different conditions. The system 10 has been specifically designed for illuminating and capturing the image of a moving object, such as the connecting terminals (e.g., leads, ball grids, and pads) of packaged electronic components in a manufacturing facility. The system 10 may, however, be used to illuminate and capture the image of any suitable moving or non-moving object.

14 Claims, 3 Drawing Sheets

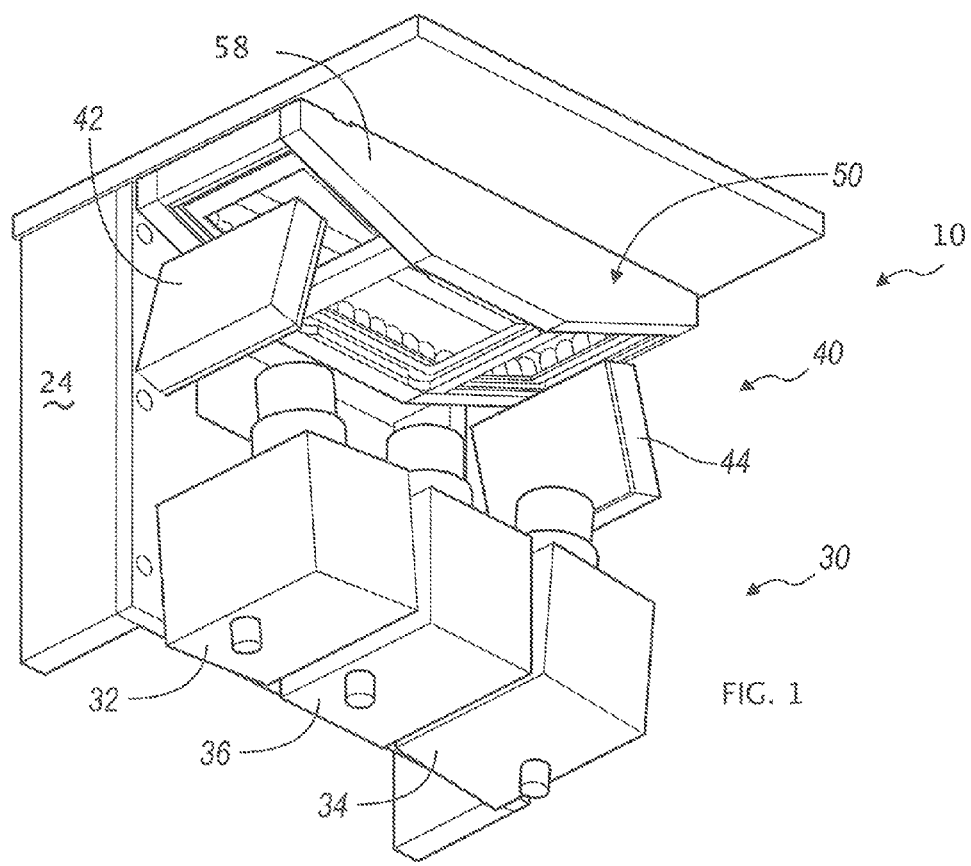
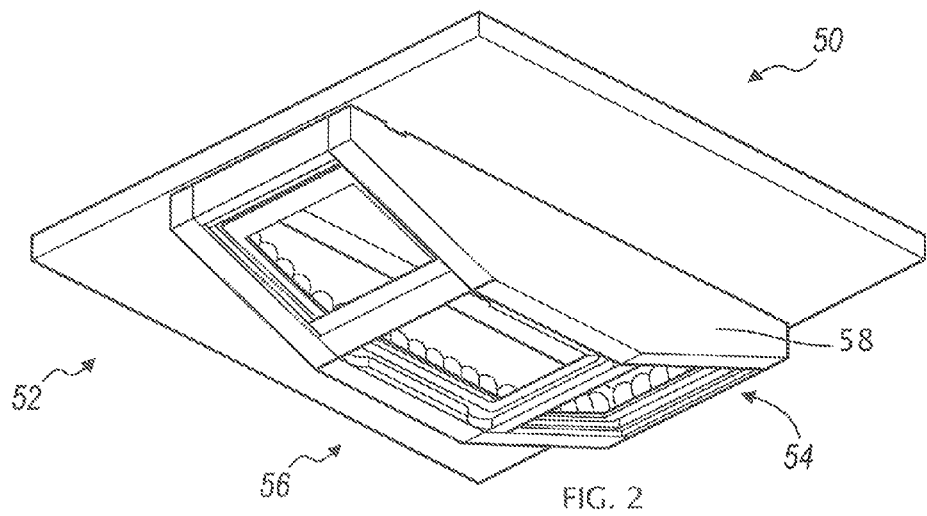

US 8,107,719 B2

MACHINE VISION SYSTEM FOR THREE-DIMENSIONAL METROLOGY AND INSPECTION IN THE SEMICONDUCTOR INDUSTRY

CROSS-REFERENCE TO RELATED APPLICATIONS

This application is a continuation-in-part of prior application number PCT US2006/023030 filed on 13 Jun. 2006 and entitled "Lighting Subsystem for a Machine Vision System", which is incorporated in its entirety by this reference. This application also claims the benefit of U.S. Provisional Application No. 60/735,778 filed 12 Nov. 2005 and entitled "3D metrology and inspection for the semiconductor industry", which is also incorporated in its entirety by this reference.

TECHNICAL FIELD

This invention relates generally to the machine vision field, and more specifically to new and useful system machine vision system for three-dimensional metrology and inspection in the semiconductor industry of the machine vision field.

BACKGROUND

In 1976, Yakimovsky and Cunningham wrote an article entitled "A System for Extracting Three-Dimensional Measurement from a Stereo Pair of TV Cameras". The article, which was published in Computer Graphics and Image Processing 7, 195-210 (1978), is incorporated in its entirety by this reference. Through a complex series of modeling, calculation, and calibration, the article discloses the calculation of an exact position of each camera, which facilitates the direct triangulation of a three dimensional position of an object.

U.S. Pat. No. 6,101,455, which is incorporated in its entirety by this reference, was issued on 8 Aug. 2000 to Michael S. Davis, one of the teachers of one of the inventors of the present invention. The '455 patent, which references the Yakimovsky and Cunningham article, discloses an automatic calibration of the cameras within a system. The '455 patent discloses a technique that includes calibrating the cameras to a common coordinate frame and moving an object a known relative distance, to determine the positions of the cameras using a vector relationship. The '455 patent does not, however, discloses the use of more than two cameras.

U.S. Pat. No. 6,064,756, which is incorporated in its entirety by this reference, was issued on 16 May 2000 and is currently assigned to Scanner Technologies Corporation. The '756 patent discloses a three dimensional inspection apparatus for ball array devices and, in one embodiment, discloses the use of three cameras. The '756 patent discloses, however, the use of triangulation to calculate a three dimensional position of the ball of a ball array device with reference to a pre-calculated calibration plane, and discloses neither the calculation of the exact position of each camera nor the direct triangulation of the three dimensional position of the ball of a ball array device.

The conventional techniques in the art, while suitable for certain applications, are not suitable for the accurate metrology of the body and connecting terminals (leads, ball grids, bumps, pads) of rapidly moving semiconductor or packaged electronic components in various manufacturing stages. The conventional techniques are simply not suitable for the inspection in such confined environments of deformation of the connection terminals in the semiconductor or packaged electronic components. In these environments, the errors introduced by the conventional techniques in the art, including both statistical error (caused by random, and therefore inherently unpredictable, fluctuations in the measurement apparatus) and systematic error (caused by an unknown but nonrandom fluctuation).

Thus, there is a need in the machine vision field to create an improved machine vision system that reduces the statistical and systematic errors to become suitable for the three-dimensional metrology and inspection in the semiconductor industry. This invention provides such improved machine vision system.

BRIEF DESCRIPTION OF THE FIGURES

FIG. 1 is a perspective view, looking upward, of the system of the preferred embodiment.

FIG. 2 is a perspective view, looking upward, of the lighting subsystem of the preferred embodiment.

DESCRIPTION OF THE PREFERRED EMBODIMENTS

Figure 3:
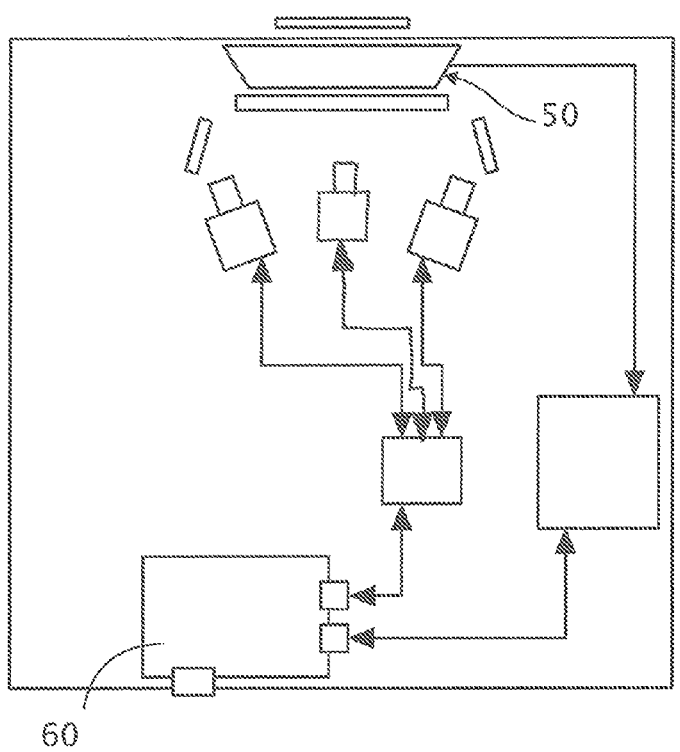
FIG. 3 is a schematic representation of the controller of the preferred embodiment.

The following description of the preferred embodiments of the invention is not intended to limit the invention to these preferred embodiments, but rather to enable any person skilled in the art to make and use this invention.

As shown in FIGS. 1 and 2, the system 10 of the preferred embodiment includes a structural subsystem 20 to provide both a stable platform and vibration isolation, a camera subsystem 30 to capture the image of a moving object when the object moves into a viewing area, a lighting subsystem 50 to illuminate a moving object, and a controller to selectively activate the camera subsystem 30 and the lighting subsystem 50 to allow observation of the reflectance of complex objects under different conditions. The system 10 has been specifically designed for illuminating and capturing the image of a moving object, such as the connecting terminals (e.g., leads, ball grids, and pads) of packaged electronic components in a manufacturing facility. The system 10 may, however, be used to illuminate and capture the image of any suitable moving or non-moving object.

The structural subsystem 20 of the preferred embodiment functions to provide a stable platform for the relative positioning of the camera subsystem 30 and the lighting subsystem 50, and also to provide isolation of the camera subsystem 30 and the light subsystem 50 from vibration. The structural subsystem 20 preferably includes an enclosure 22 and a back plate 24. The enclosure 22 functions to provide a relatively rigid connection to the ground or other suitable stable structure. Preferably, the enclosure 22 is placed or mounted to the mechanical structure of a machine that manufactures, inspects, and/or packages the semiconductor or packaged electronic components. Alternatively, the enclosure 22 may be placed or mounted in any suitable location and to any suitable device or structure. The back plate 24 functions to provide a relatively rigid connection between the camera subsystem 30 and the lighting subsystem 50, and a relatively compliant connection between the enclosure 22 and the combination of the camera subsystem 30 and the lighting subsystem 50. The back plate 24 is preferably made of heavy gauge anodized aluminum, which is low in weight and high in thermal conductivity. The high thermal conductivity of the back plate 24 promotes heat transfer from the camera subsystem 30, which may otherwise introduce error into the system. The back plate 24 is preferably suspended against the enclosure. The suspension preferably includes a single connecting plane, but may alternatively include any other mounting methods or devices that provides vibration isolation and mounting distortion isolation between the back plate and the enclosure. The isolation of the camera subsystem 30 from vibration, mounting distortion, and other sources of errors increases the accuracy of the system, thereby facilitating the use of the system 10 for the three-dimensional metrology and inspection in the semiconductor industry.

The camera subsystem 30 of the preferred embodiment, which is mounted to the back plate 24 of the structural subsystem 20, functions to capture the image of a moving object when the object moves into a viewing area. The cameras are preferably rigidly mounted so that if and when they vibrate, they all vibrate together. Preferably, the camera subsystem 30 includes a first camera 32, a second camera 34, and a third camera 36 to provide information on the moving object from several angles. The camera subsystem 30 may, however, include any suitable number of cameras to provide information on the moving object from several angles. Each camera is preferably a CCD-type camera with a resolution of at least 4M Pixels at 12-bit grayscale and a field of view of at least 50 mm by 50 mm. Each camera may, however, be any suitable type of image capturing device with any suitable resolution and any suitable field of view. The cameras are preferably symmetrically arranged relative to an object in the viewing field and each camera preferably has a unique viewing angle of the viewing area. In a first variation, the first camera 32 and the second camera 34 preferably have acute and obtuse viewing angles that are complimentary (e.g., 60° and 120°), while the third camera preferably has a perpendicular viewing angle (i.e., 90°). In a second variation, the cameras are radially spaced an equal amount about a Z axis (e.g., 60° for three cameras), while all having the same viewing angle (e.g., 75°) to the Z axis.

The determination of the three-dimensional metrology of an object based on the use of captured images of a single time instance from three (or more) camera pairs in a symmetrical arrangement facilitates a dramatic increase in the accuracy and repeatability of the system 10, based on the reduction in both statistical error (caused by random, and therefore inherently unpredictable, fluctuations in the measurement apparatus) and systematic error (caused by an unknown but nonrandom fluctuation). The use of captured images of a single time instance prevents any movement or vibration of the object from causing a significant reduction in the accuracy of the system. The use of a symmetrical arrangement tends to cancel, or at least reduce, the systematic error (such as the slight movement of one camera after calibration) because errors from opposing camera pairs cancel. The use of three (or more) cameras pairs tends to cancel, or at least reduce, the statistical error because of the determination of the three-dimensional metrology of an object can be calculated three or more times using, for example, the following three camera pairs: C1 and C2; C1 and C3; and C2 and C3. The three determinations from these camera pairs can be averaged (or otherwise statistically analyzed in any suitable manner) to significantly reduce statistical error caused by random, and therefore inherently unpredictable, fluctuations in the measurement apparatus.

As shown in FIG. 1, the system 10 of the preferred embodiment may also include a mirror assembly 40. The mirror assembly 40 functions to allow compactness of the system 10 and to facilitate particular viewing angles of the first camera 32 and the second camera 34. Preferably, the mirror assembly 40 includes a first mirror 42 that optically folds the view of the first camera 32, and a second mirror 44 that optically folds the view of the second camera 34. The mirror can be placed between the lens and the object as shown, or the mirror can be placed between the camera and the lens.

Figure 4:
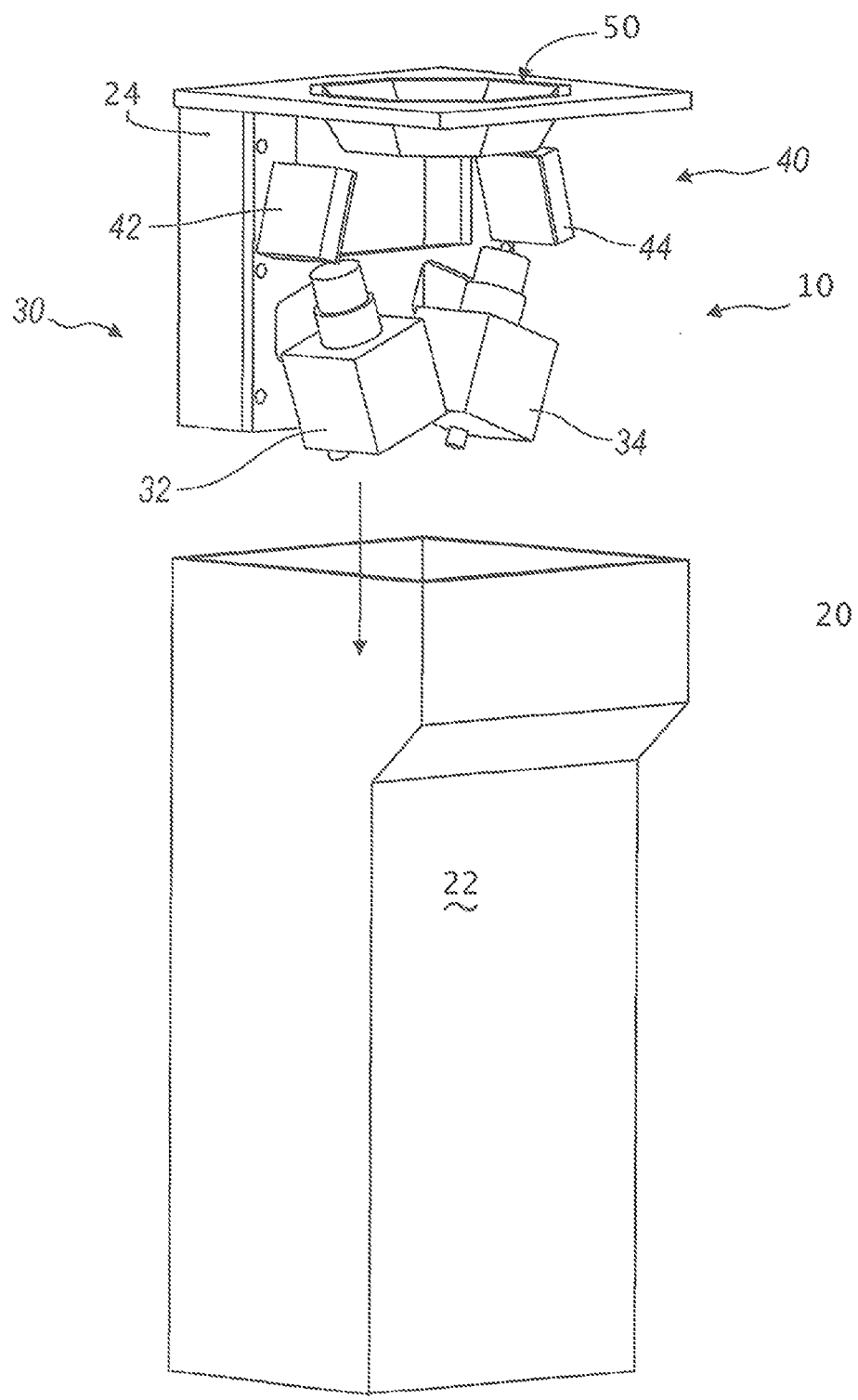
FIG. 4 is a perspective view, looking downward, of the system of the preferred embodiment.

As shown in FIGS. 1 and 2, the lighting subsystem 50 of the preferred embodiment functions to illuminate the moving object with short pulses of intense light. The lighting subsystem 50 preferably includes a first light group 52 with light sources aimed toward the viewing area along the viewing angle of the first camera 32, a second light group 54 with light sources aimed toward the viewing area along the viewing angle of the second camera 34, and a third light group 56 with light sources aimed toward the viewing area along the viewing angle of a third camera 36. Additional lighting, either direct or indirect, may be provided (as shown in FIG. 4). Preferably, the lighting subsystem 50 is mounted on a structural member 58 with a trapezoidal shape and the camera subsystem 30 and structural member 58 are arranged such that the cameras point through holes in the structural member 58. The structural member 58 is preferably mounted directly or indirectly to the back plate 24. The lighting subsystem 50 may, however, be mounted on any suitable structural member. The lighting subsystem 50 preferably includes at least 8 high-intensity LEDs in each of the light groups, but may alternatively include any suitable number of suitable light sources.

As shown in FIG. 3, the controller 60 of the first preferred embodiment, which is connected to the camera subsystem 30 and the lighting subsystem 50, functions to control the camera subsystem 30 and the lighting subsystem 50 to allow observation of the reflectance of the illumination by the moving object under different conditions. In one variation, the controller 60 controls the activation of the lighting subsystem 50. Based on the information collected by a machine vision subsystem (such as the position of the object read from an encoder), the controller 60 may adjust the activation of the light sources of the lighting subsystem 50 to strobe at a faster or slower cycle (e.g., 50 ms), at an earlier or later time within the cycle (+1 ms), for a longer or shorter duration (e.g., 5-50 microseconds), and/or at a higher or lower intensity (e.g., 0-50 amps). Through the manipulation of the activation of the camera subsystem 30 and the lighting subsystem 50, the system 10 of the preferred embodiment may effectively freeze and inspect the reflectance of the illumination by the moving object. The controller 60 may, however, adjust any suitable parameter of the camera subsystem 30 and/or the lighting subsystem 50 to allow observation of the reflectance of the illumination by the moving object under different conditions.

The calibration of the system 10 preferably includes a reference target. The reference target is preferably a glass target with a grid of dots (available from Max Levy Autograph, Inc. of Philadelphia, Pa.). The reference target with the grid of dots functions to provide positions along two axes (such as the X and Y axes). The calibration of the system 10 further preferably includes a micrometer. The micrometer functions to mount the reference target and move the reference target along the third axis (such as the Z axis). The micrometer preferably includes a user interface, such as a knob, to allow manual adjustment of the reference target, but may alternatively include an automated device or process. The conventional techniques includes either a three dimensional target or a multi-axis robot which can move a single dot along the X, Y, and Z axes. By eschewing the conventional techniques, the calibration of the system 10 significantly reduces the expense of the calibration of the system 10. The calibration of the system 10 may, however, use the conventional techniques and/or may incorporate calibration correction techniques to improve accuracy. By using a reference target as part of its calibration technique to calculate the exact position of each of the cameras of the camera subsystem 30 in relation to a coordinate frame in the observable three dimensional measurement volume, the camera locations may be used to triangulate directly on an object within this geometrically rectified three dimensional viewable volume to determine the three dimensional shape and location of an object.

As a person skilled in the art will recognize from the previous detailed description and from the figures and claims, modifications and changes can be made to the preferred embodiments of the invention without departing from the scope of this invention defined in the following claims.

We claim:

1. A machine vision system for the three-dimensional metrology of a rapidly moving semiconductor or packaged electronic objects in various stages within a manufacturing facility, the system comprising:
   a structural subsystem including an enclosure mounted to the ground of the manufacturing facility, and including a back plate suspended from the enclosure, wherein the suspension of the back plate from the enclosure isolates the back plate from a vibration of the enclosure;
   a camera subsystem adapted to capture the image of a moving object when the object moves into a viewing area, wherein the camera subsystem includes a first camera mounted to the back plate, a second camera mounted to the back plate, and a third camera mounted to the back plate;
   a lighting subsystem connected to the back plate and adapted to illuminate the moving object, wherein the lighting subsystem comprises a first light group, a second light group and a third light group; and
   a processor adapted to receive the captured images from the cameras and to calculate a first determination of the three-dimensional metrology of the moving object based on the captured images from the first camera and the second camera, a second determination of the three-dimensional metrology of the moving object based on the captured images from the first camera and the third camera, and a third determination of the three-dimensional metrology of the moving object based on the captured images from the second camera and the third camera;
   wherein the structural subsystem, the camera subsystem, and the processor cooperate to reduce the statistical and systematic errors of the machine vision system to enable accurate three-dimensional metrology and inspection of the rapidly moving objects.

2. The machine vision system of claim 1, wherein the processor is further adapted to calculate a final determination of the three-dimensional metrology of the moving object based on the first determination, the second determination, and the third determination of the three-dimensional metrology of the moving object.

3. The machine vision system of claim 2, wherein the processor is further adapted to calculate a final determination of the three-dimensional metrology of the moving object based on an average of the first determination, the second determination, and the third determination of the three-dimensional metrology of the moving object.

4. The machine vision system of claim 1, wherein each camera of the camera subsystem has a unique viewing angle of the moving object.

5. The machine vision system of claim 1, wherein the cameras of the camera subsystem are symmetrically arranged relative to the moving object.

6. The machine vision system of claim 5, wherein the first camera is disposed at an acute angle relative to a plane parallel to the viewing field, the second camera is disposed at an obtuse angle relative to a plane parallel to the viewing field, and the third camera is disposed orthogonal relative to a plane parallel to the viewing field.

7. The machine vision system of claim 6, wherein the acute angle and the obtuse angle sum to approximately one hundred eighty degrees.

8. The machine vision system of claim 5, wherein the first, second and third cameras are disposed in a plane parallel to the viewing field.

9. The machine vision system of claim 8, wherein each of the first, second and third cameras are each aligned at a predetermined angle relative to a line orthogonal to the plane.

10. The machine vision system of claim 1, wherein the back plate provides a relatively rigid connection between each of the cameras.

11. The machine vision system of claim 10, wherein the back plate is made of heavy gauge anodized aluminum.

12. The machine vision system of claim 1, wherein the first camera is adapted to image the moving object at a first viewing angle, wherein the second camera is adapted to image the moving object at a second viewing angle, and wherein the third camera is adapted to image the moving object at a third viewing angle;
   wherein the first light group comprises a first light source aimed toward the viewing area along a first viewing angle, the second light group comprises a second light source aimed toward the viewing area along a second viewing angle, and the third light group comprises a third light source aimed toward the viewing area along a third viewing angle.

13. The machine vision system of claim 1, further comprising a controller coupled to the camera subsystem and to the lighting subsystem and adapted to control the camera subsystem and the lighting subsystem to effectively freeze and inspect the moving object.

14. The machine vision system of claim 1, further comprising a structural member connecting the lighting subsystem and back plate.

* * * * *